United States Patent
Ramones et al.

(10) Patent No.: US 12,426,174 B2
(45) Date of Patent: Sep. 23, 2025

(54) MOUNTING BRACKET FOR ELECTRONIC DEVICE

(71) Applicant: Netgear, Inc., San Jose, CA (US)

(72) Inventors: John Kui Yin Ramones, San Ramon, CA (US); Aron Han, San Jose, CA (US); Edwin Marfa Kalubiran, Milpitas, CA (US)

(73) Assignee: Netgear, Inc., San Jose, CA (US)

( * ) Notice: Subject to any disclaimer, the term of this patent is extended or adjusted under 35 U.S.C. 154(b) by 72 days.

(21) Appl. No.: 18/378,781

(22) Filed: Oct. 11, 2023

(65) Prior Publication Data

US 2025/0126725 A1    Apr. 17, 2025

(51) Int. Cl.
| | |
|---|---|
| *H05K 5/02* | (2006.01) |
| *F16M 11/02* | (2006.01) |
| *F16M 13/02* | (2006.01) |
| *H02G 3/20* | (2006.01) |

(52) U.S. Cl.
CPC ........... *H05K 5/0204* (2013.01); *F16M 11/02* (2013.01); *F16M 13/02* (2013.01); *H02G 3/20* (2013.01)

(58) Field of Classification Search
CPC ................................ H05K 5/0204; H02G 3/20
See application file for complete search history.

(56) References Cited

U.S. PATENT DOCUMENTS

| | | |
|---|---|---|
| 9,161,465 B2 | 10/2015 | Chen et al. |
| 9,303,811 B1 | 4/2016 | Lutz, Jr. et al. |
| 9,404,615 B1 | 8/2016 | Gonzalez et al. |
| 9,955,597 B1 | 4/2018 | Wu |
| 10,161,565 B2 | 12/2018 | Wu |
| 10,514,127 B2 | 12/2019 | Wu et al. |
| 10,533,703 B1 | 1/2020 | Nguyen |
| 10,774,985 B1 | 9/2020 | Ortel et al. |
| 11,092,282 B2 | 8/2021 | Weng et al. |
| 11,158,927 B1 | 10/2021 | Rosenthal et al. |
| 11,326,735 B1 | 5/2022 | Rosenthal et al. |
| 2011/0242737 A1* | 10/2011 | Liang ............ H04M 1/0237 361/679.01 |
| 2022/0042645 A1 | 2/2022 | Wu et al. |

\* cited by examiner

*Primary Examiner* — Hung V Ngo
(74) *Attorney, Agent, or Firm* — Boyle Fredrickson, S.C.

(57) ABSTRACT

An adjustable mounting bracket is configured to be adjusted between multiple positions to accommodate electronic devices having different lengths. The mounting bracket includes a main plate that is adjustable relative to a slide plate. Each of the main plate and the slide plate has an attachment point for attachment to an electronic device. More specifically, the main plate may include one or more ridges having a slot formed therein with multiple spaced detents. A screw may be releasably inserted into a desired detent in order to secure the main plate to the slide in a desired configuration. A twist clip may be provided for releasably securing the adjustable bracket to a T-bar.

19 Claims, 21 Drawing Sheets

MOUNTING BRACKET FOR ELECTRONIC DEVICE

BACKGROUND OF THE INVENTION

1. Field of the Invention

The present invention relates to mounting of electronic devices, and more particularly, to a universal mounting bracket that is quickly and easily adjustable to a variety of different sizes to accommodate different electronic devices without removing the mounting bracket from a mounted position relative to a building. The invention additionally relates to method of installing and/or using such a mounting bracket.

2. Discussion of the Related Art

A variety of different electronic devices are mounted to ceilings, walls, and other surfaces about office buildings and other commercial, industrial, and residential buildings. For instance, access points for providing wireless internet connections between devices in an environment and/or between the environment to the internet of things are routinely mounted to ceilings located in common spaces of a building. These devices include access points, bridges, adapters, and extenders. In some instances, the electronic devices may be mounted directly to drywall, or into an existing electrical service box. In some instances, access points are mounted to so-called "T-bar" supports that suspend a drop ceiling from a structural ceiling.

Depending on the specific prevailing needs of a given space, electronic devices of different lengths may be needed. For instance, longer or shorter access points may be needed depending on the bandwidth and volume demands of a given space. These demands can fluctuate over time with the use of additional devices and/or devices requiring higher bandwidths. Additionally, access points and other electronic devices are routinely switched out for newer models having improved operating characteristics. These different electronic devices may have different sizes and/or shapes, including different lengths. Traditional mounting brackets for access points were dimensioned and shaped to accommodate an electronic device having a specific size and shape. In the event that a larger or smaller device was subsequently needed, the traditional mounting bracket would therefore need to be uninstalled, after which a new mounting bracket configured for the specific electronic device would be reinstalled. This need for uninstallation and installation added both time and costs to upgrades and other changes.

Furthermore, many traditional mounting brackets configured for different sized or shaped electronic devices have very similar appearance, despite each mounting bracket having slightly different dimensions and/or mounting configurations in order to accommodate a specific electronic device. As such, it can be difficult to determine whether the correct mounting bracket has been selected until a user attempts to install it in a given space and then attach the electronic device to the mounting bracket. This results in wasted time and frustration when an incorrect mounting bracket is initially selected.

Consequently, it is desirable to provide a universal mounting bracket that can be installed on a T-bar or similar structure once, after which it can be quickly and easily adjusted to accommodate access points or other electronics devices of different lengths without the need to uninstall and remove the mounting bracket and replace it with another mounting bracket.

SUMMARY OF THE INVENTION

In accordance with an aspect of the invention, this and other needs are met by providing an adjustable mounting bracket that can quickly and easily be installed relative to a building, after which it can be incrementally adjusted in order to accommodate electronic devices of different lengths. The mounting bracket includes a main plate and a slide plate that is movable longitudinally between multiple positions relative to the main plate.

The main plate may include an attachment plate and first and second ridges having slots formed therethrough and multiple detents formed along the slot. The slide plate can quickly and easily be adjusted relative to the main plate so that the adjustable mounting bracket is movable between different sizes. When the mounting bracket is at a desired length, fasteners, such as screws, can be inserted through the slot in engagement with a selected detent to secure the main plate to the slide plate. Thereafter, if a new electronic device having a different size and/or length needs to be mounted to the mounting bracket, the fasteners can be temporarily loosened while the slide plate is reoriented relative to the main plate. The slide plate may further include a base with first and second arms extending from the base, with each of the arms being configured to slide within the ridges of the main plate. The first arm is releasably secured to the first ridge by a first fastener, and the second arm is releasably secured to the second ridge about a second fastener. The bracket 20 can be mounted on an existing support such as a T-bar associated with a drop ceiling.

According to another aspect of the invention, a twist clip is provided to facilitate mounting of the mounting bracket to a T-bar or other a preexisting support. The twist clip includes a body and at least two or more hooks configured to hang the body from a support, such as opposite sides of a T-bar. Additionally, the twist clip may include at least two tabs that extend from the main body that are configured to engage with portions of the main plate and/or the slide plate. For instance, the main body may have arcuate key-shaped openings formed therein, in which case the tabs can be initially inserted into the larger section of key-shaped opening, after which the twist clip may be twisted so that the main body is then supported by and resting on the tabs. The main body may have other openings formed at specific spacings and locations that coincide with the locations of mounting locations of standardized electronic junction boxes. This enables the main body to be mounted directly to existing standardized electronic junction boxes. Further still, the main body may be installed directly into drywall anchors.

According to another aspect of the invention, the main plate and/or slide plate may include additional features to enable easy mounting of different electronic devices on the bracket. For instance, the main plate may include hooks that are configured to engage with openings formed in a first end of the electronic device. Thereafter, the electronic device may be pivoted upwardly towards the mounting bracket about the hooks. Additionally, the mounting bracket may include a release button with a tab extending therefrom that can engage with another opening formed in a second end of the electronic device. A screw or other locking mechanism may be used with the release button to avoid inadvertent disengagement.

Also enclosed is a method of installing an electronic device on a mounting bracket having at least some of the characteristics described above.

These and other features and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Preferred exemplary embodiments of the invention are illustrated in the accompanying drawings in which like reference numerals represent like parts throughout, and in which.

Figure 1:
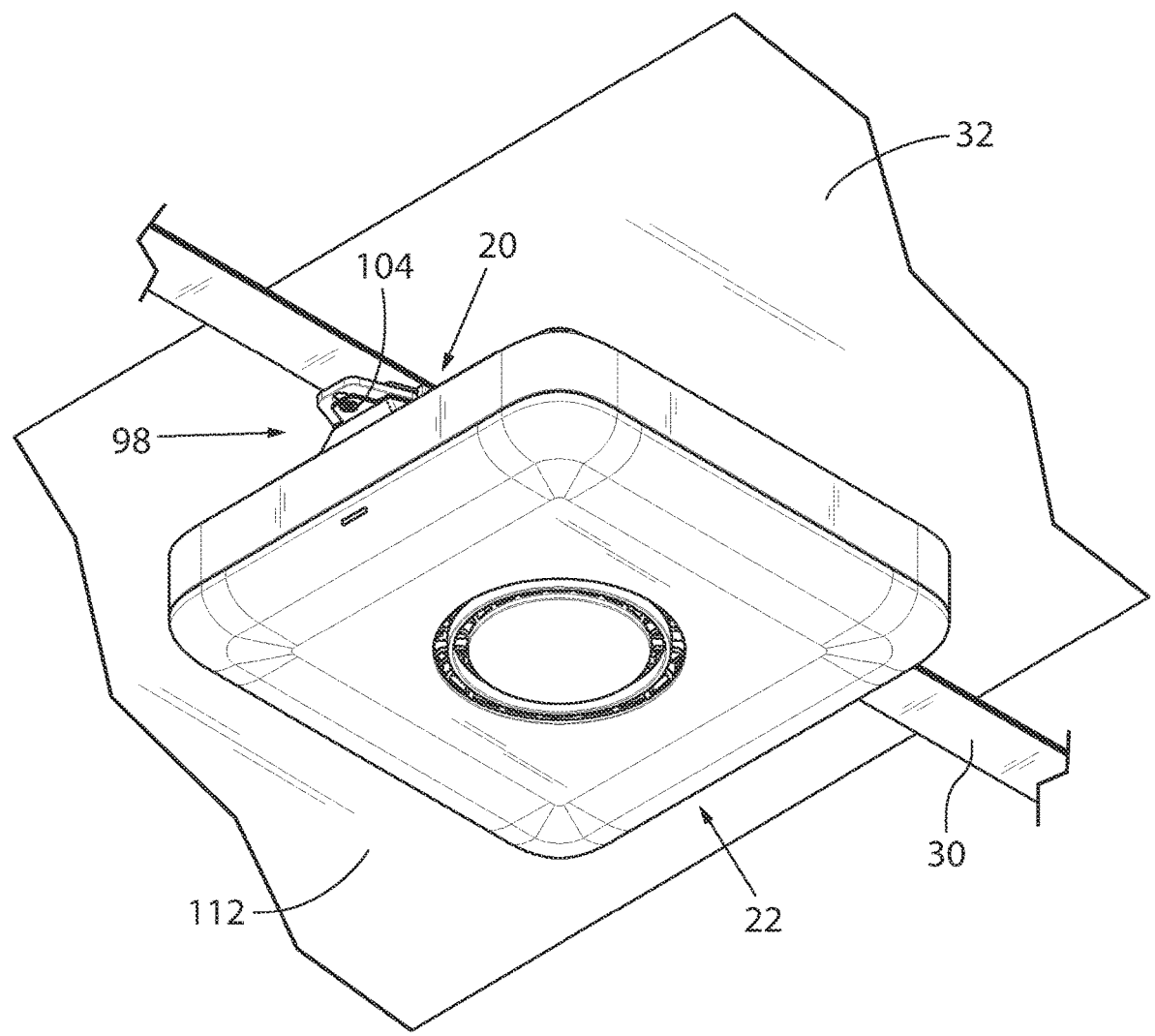
FIG. 1 is a perspective view of an adjustable mounting bracket secured to a T-bar with an access point electronic device mounted thereto.

In describing the exemplary embodiment of the inventions which are illustrated in the drawings, specific terminology will be resorted to for the sake of clarity. However, it is not intended that the invention be limited to the specific terms so selected, and it is to be understood that each specific term includes all technical equivalents which operate in a similar manner to accomplish a similar purpose. For example, the words "connected", "attached", "supported", or terms similar thereto are often used. They are not limited to direct connection but include connection through other elements where such connection is recognized as being equivalent by those skilled in the art.

DETAILED DESCRIPTION OF THE PREFERRED EMBODIMENTS

Referring now to FIG. 1, in accordance with an aspect of the invention, a universal electronic mounting bracket 20 is provided that enables an electronic device, as shown an access point 22, to be quickly and easily mounted in place relative to a building. Other wired and wireless electronic devices, usable for both wired and wireless applications, could be used with bracket 20 and other brackets constructed in accordance with the invention as well. Such electronic devices include, but are not limited to, extenders, bridges, and adapters.

Still referring to FIG. 1, the mounting bracket 20 includes a main plate 24 and a slide plate 26 that is slidably connected to the main plate 24. The mounting bracket 20 may additionally include a twist clip 28 or other mounting components that engages directly with a preexisting portion of the building. For instance, the illustrated twist clip 28 is configured to engage with a T-bar 30 associated with a ceiling 32 of the building. In other embodiments, the twist clip is not needed and the mounting bracket 20 is mounted to other components as described below.

Figure 2:
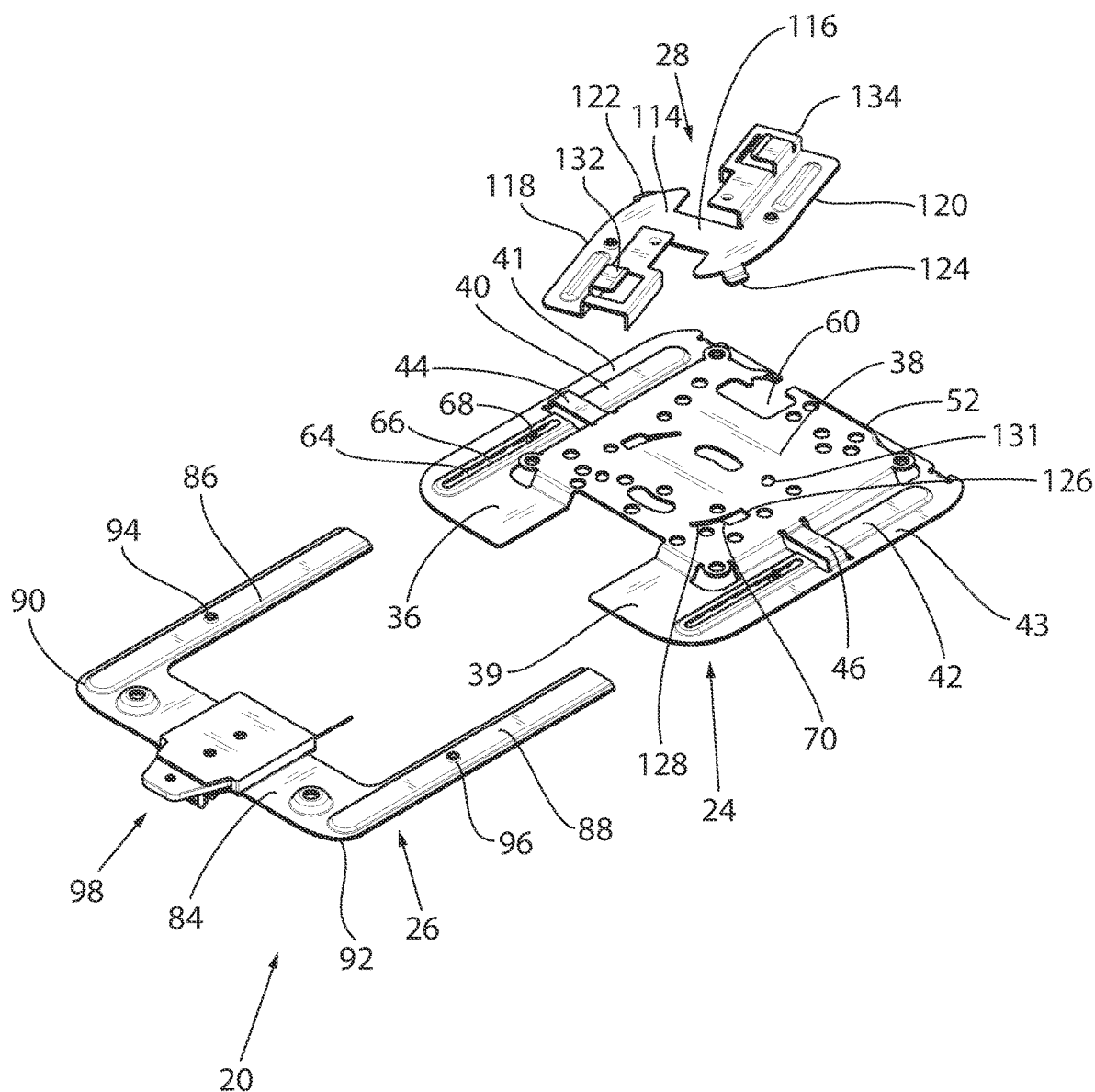
FIG. 2 is an exploded perspective view of the adjustable mounting bracket, shown above the bracket.
Figure 3:
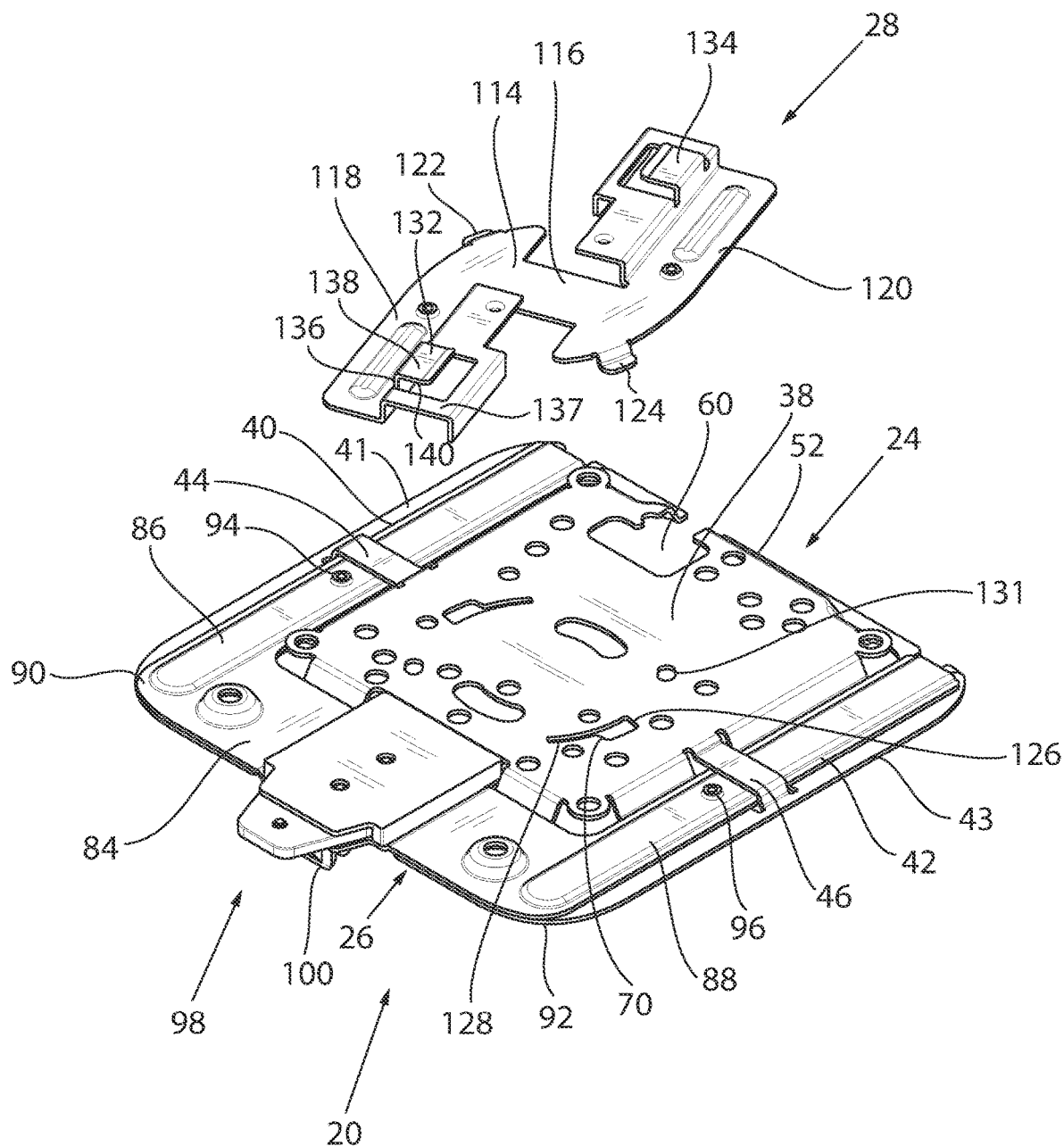
FIG. 3 is a partially assembled perspective view of the adjustable mounting bracket of FIG. 2.

Turning to FIGS. 2 and 3, the main plate 24 will now be described. The main plate 24 is shown in an upwardly facing orientation, as would be the case when the bracket 20 is mounted on a ceiling. The main plate 24 may be formed, for example, from a single piece of stamped metal. Main plate 24 includes a substantially horizontally-extending base 36 in which is formed an attachment plate 38. As shown, the base 36 includes a laterally extending end 39 extending from an end of the attachment plate 38, and first and second sides 41, 43 extending longitudinally rearwardly from first and second sides of the attachment plate 38. The main plate also has first and second ridges 40, 42 formed in the first and second sides 41, 43 of the base 36, with the ridges 40, 42 located on opposite sides of the attachment plate 38 and extending longitudinally along at least the majority of the length of the attachment plate 38. As shown in the figures, a major plane of the attachment plate 38 is vertically offset from the top surfaces of the ridges 40 and 42. The main plate 24 further includes first and second bridges 44, 46 that extend laterally from the attachment plate 38 and across and over the tops of the ridges 40, 42 centrally of the ridges 40, 42. These bridges 44, 46 are configured to engage with the arms 86 and 88 of the slide plate 26 as will further be described below. It should be noted that the ridges 40 and 42 are not essential.

They merely facilitate sliding of the side plate 26 along the main plate 24 without binding.

Figure 8:
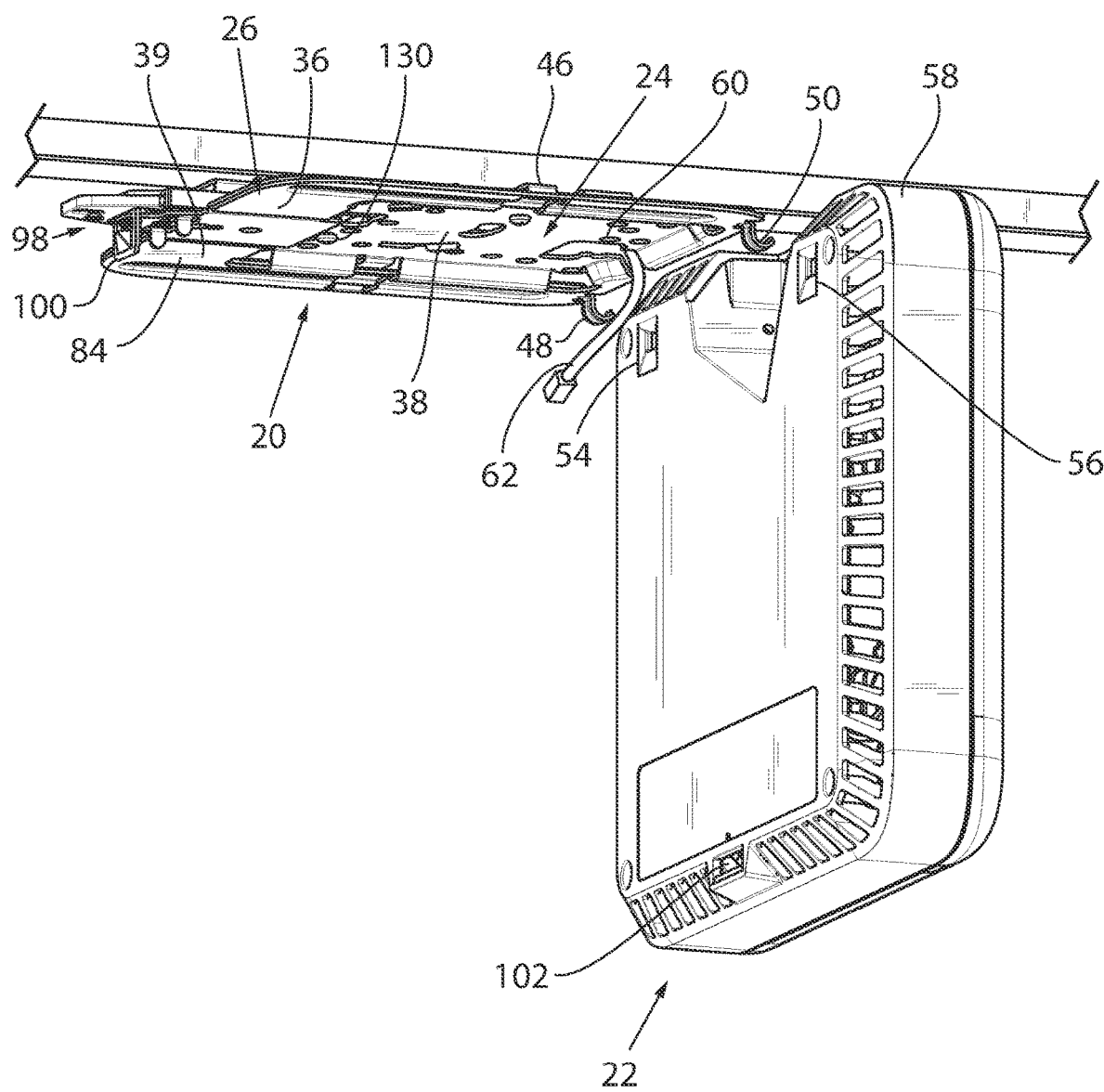
FIG. 8 is a perspective view of the electronic device located adjacent to the mounting bracket.
Figure 9:
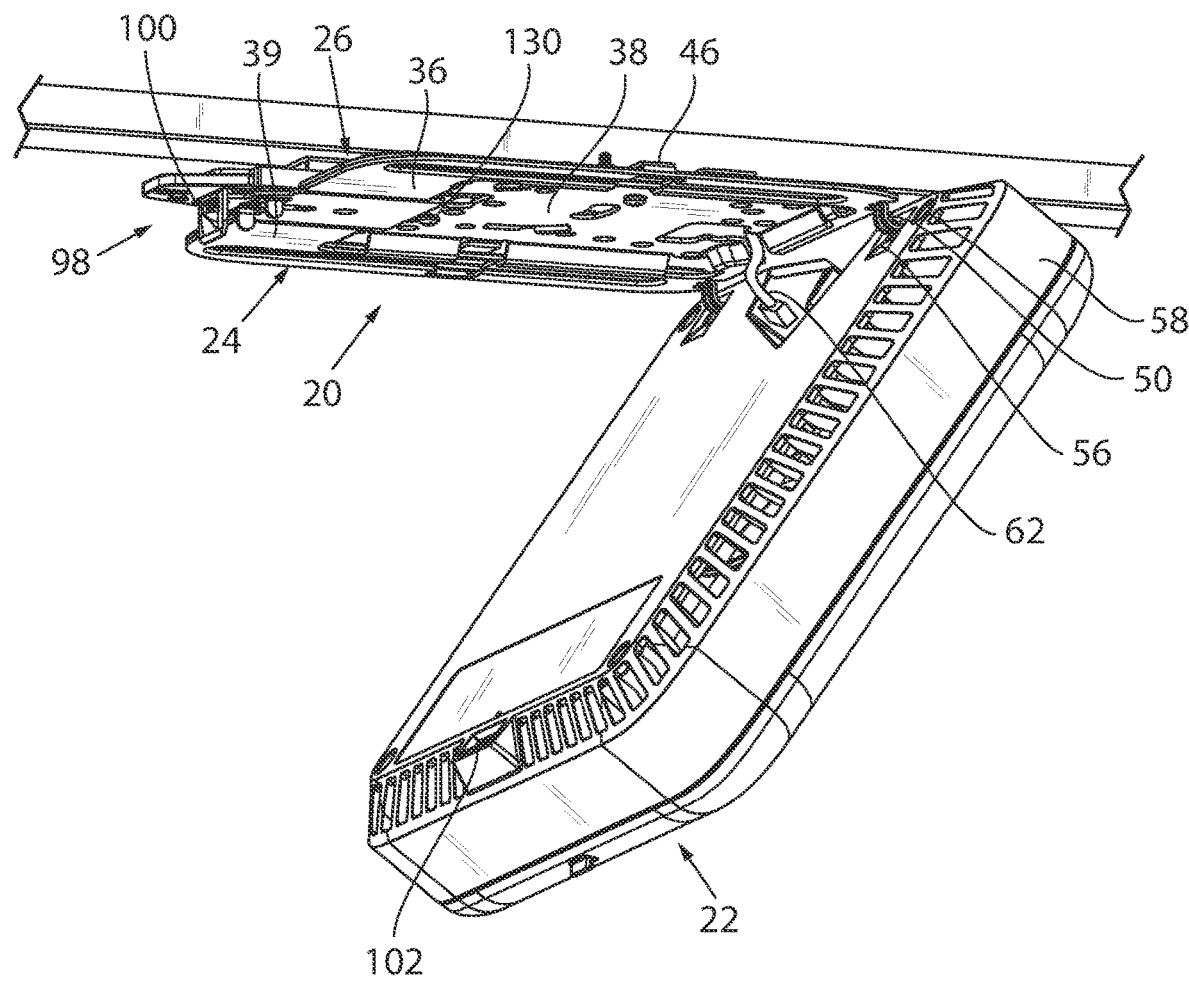
FIG. 9 is a perspective view of the electronic device of FIG. 8 while it is pivoted upwardly towards the mounting bracket.
Figure 10:
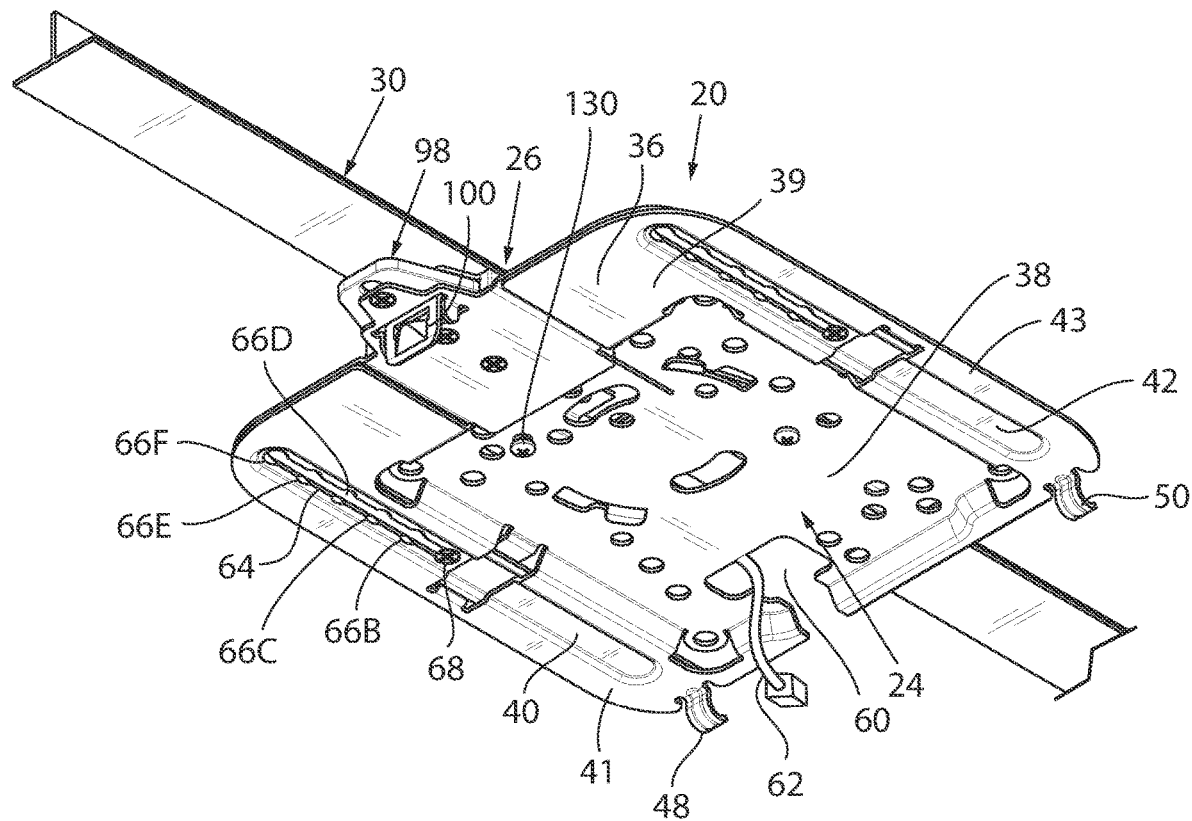
FIG. 10 is a perspective view of the adjustable mounting bracket in a first configuration.

Additionally, mounting points for the access point are provided on the main plate 24. These mounting points could, for example, be apertures for receiving screws or other fasteners. In the present embodiment, the mounting points comprise one or more hooks, as shown first and second hooks 48, 50, that extend downwardly from a first end 52 of the main plate 24 that engage with the access point 22 as shown in FIGS. 8 and 9. More specifically, the access point 22 has correspondence openings 54, 56 adjacent to an end 58 of the access point 22 that enable the access point 22 to hang from the hooks 48, 50. See FIG. 8. Once the access point 22 is hung from the hooks 48, 50, the access point 22 can be pivoted upwardly towards the mounting bracket 20. See FIG. 9. The main plate 24 also includes a cord cutout 60 located adjacent the first end 52 that enables an electrical cord 62 that connects to the access point 22 to extend through the main plate 24 as seen in FIGS. 8-10.

The front end portion of each of the first and second ridges 40, 42 features an elongate slot that extend longitudinally along a portion of the respective ridge 40, 42, for instance, approximately halfway along the first and second ridges 40, 42 in the illustrated embodiment. Only the slot 64 associated with the first ridge 40 will be described herein, but it is understood that the slot associated with the second ridge 42 would have all of the same features. A plurality of arcuate, longitudinally spaced, detents 66 are formed along the length of each slot 64. Each detent 66 is configured to cooperate with a screw 68 or other fastener. See FIGS. 10-13. The screws 68 may be tightened or loosened to enable the slide plate 26 to be adjusted relative to the main plate 24. These detents 66 allow for incremental adjustments of the length of the mounting bracket 20. For instance, as shown, there are six detents 66A, 66B, 66C, 66D, 66E, 66F that enable the mounting bracket 20 to be adjusted to six different size (length) configurations. Of course, there could be additional or fewer detents to enable the mounting bracket 20 to be moved between any number of desired configurations. As shown, the spacing between each set of successive detents 66 is approximately 10 millimeters, such that the length of the mounting bracket 20 can be adjusted up to 50 millimeters between a maximum length and a minimum length. A legend (not shown) may be provided directly next to the detents to simplify the adjustable use of the main plate and slide, for instance with a number of 1-6 located directly next to each opening. In such a configuration, each access point 22 may come with an identifier, such as the number of the detents that results in the correct size mounting bracket 20, that corresponds to the legend. This simplifies selection of the adjustable location that the mounting bracket 20 should be set at for a new access point 22. The slots and detent in each ridge also could be replaced by discrete spaced openings. Alternatively, the detents could be eliminated, providing for continuous rather than incremental length adjustment.

Figure 14:
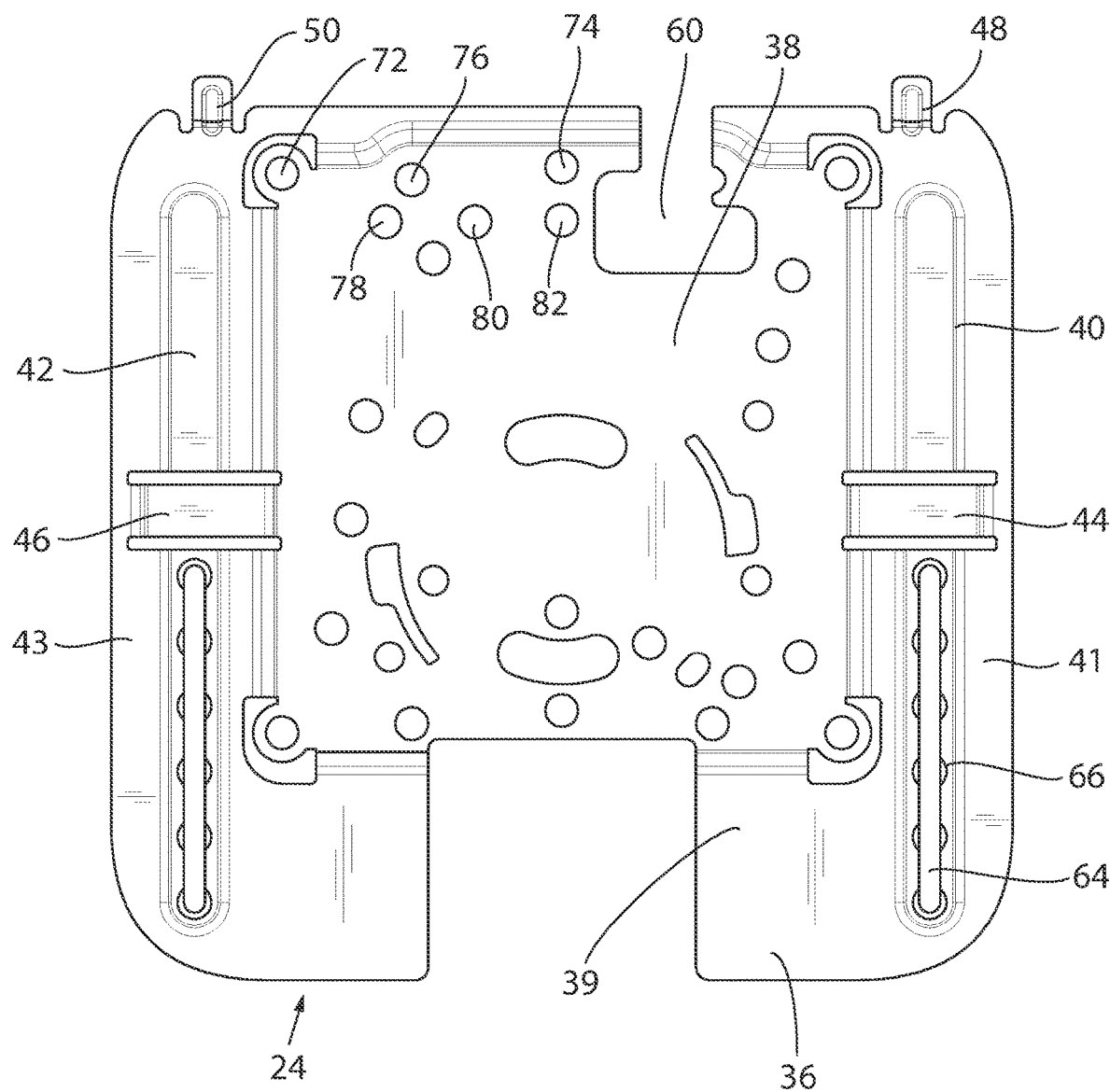
FIG. 14 is a top plan view of a main plate of the adjustable mounting bracket showing a plurality of openings formed therein.
Figure 15:
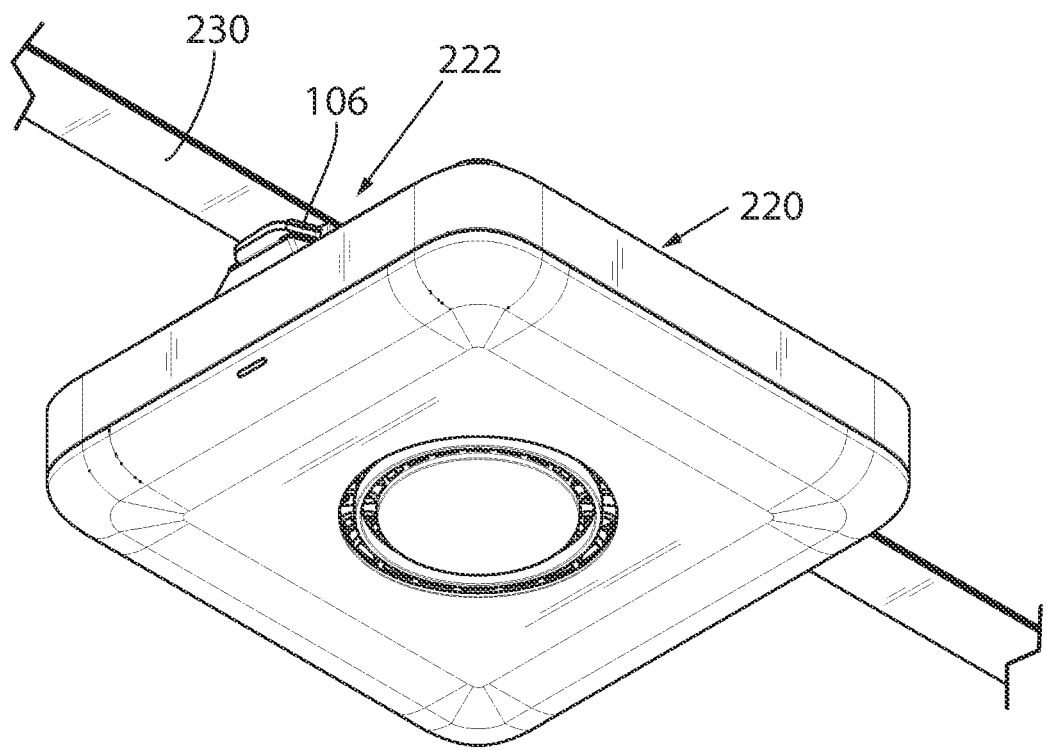
FIG. 15 is a perspective view of another embodiment of the adjustable mounting bracket secured to a T-bar with an access point electronic device mounted thereto.

Additionally, the attachment plate 38 further includes a plurality of holes, slots, and arcuate and other openings formed therein, collectively referred to merely as openings. These various openings are located at orientations and distances that enable the main plate 24 to be mountable to any number of different preexisting supports, as will further be described below. As shown, these openings include one or more arcuate key-shaped openings 70 that extend through the attachment plate 38 of the main plate 24. These key-shaped openings 70 are configured to engage with a twist clip 28 as will further be described below. Additional openings are configured to accommodate mating mounting openings for standard electrical fixtures, including junction box mounting openings 72, single gang mounting openings 74, double gang mounting openings 76, 4" round/octagon box mounting openings 78, 3.5" round/octagon box mounting openings 80, and EU box mounting openings 82. See FIG. 14.

The slide plate 26 will now be further described.

Figure 4:
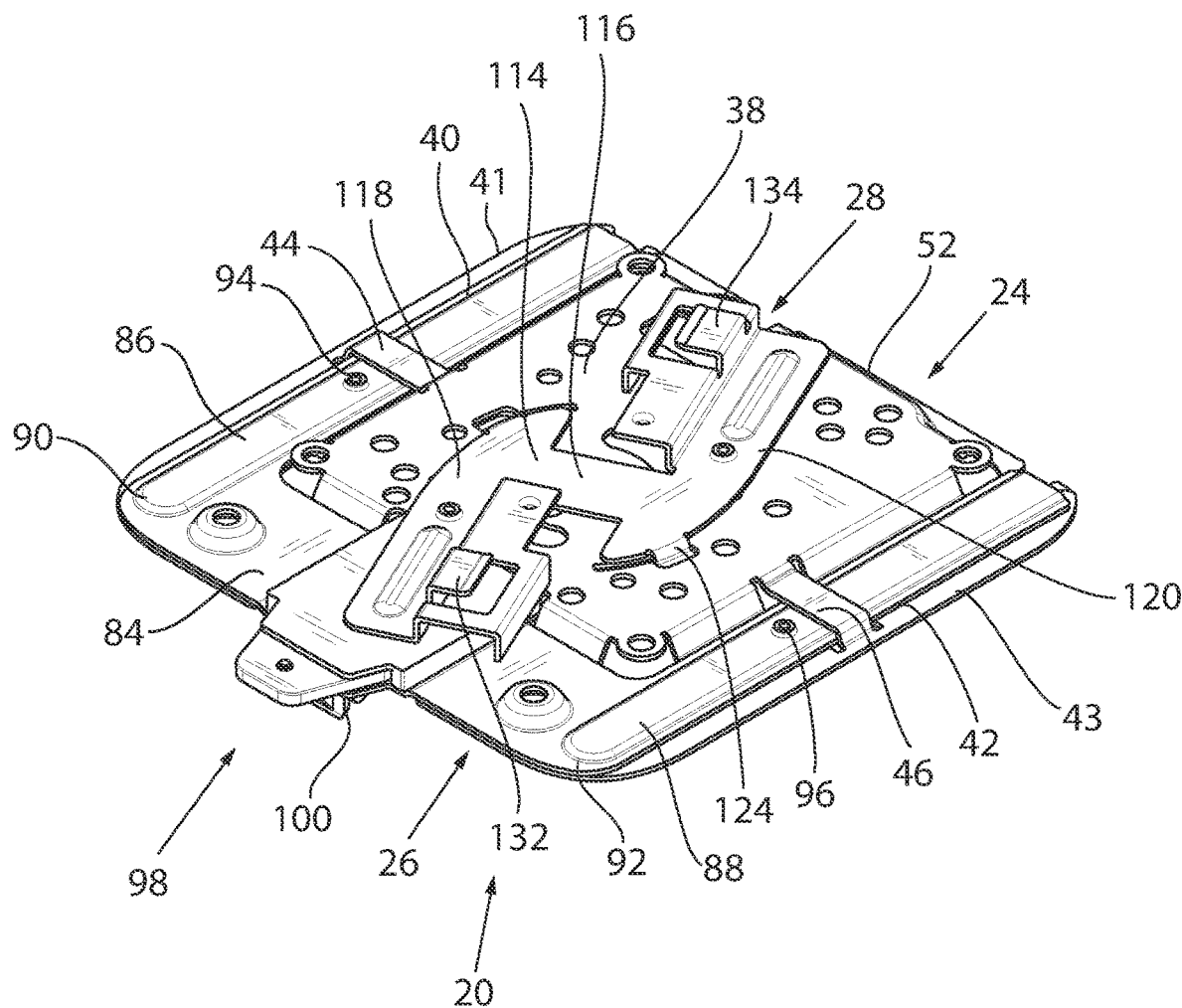
FIG. 4 is a partially assembled perspective view of the adjustable mounting bracket of FIGS. 2 and 3.
Figure 5:
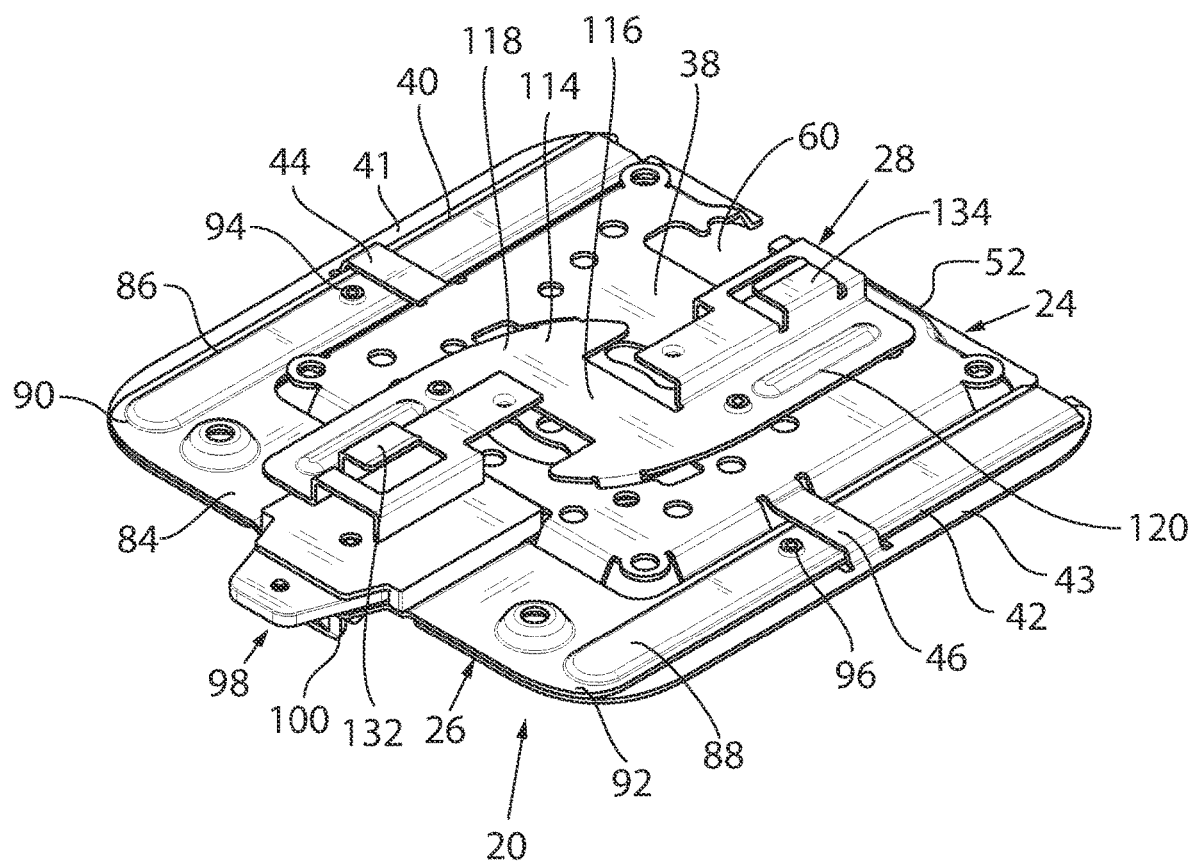
FIG. 5 is an assembled perspective view of the adjustable mounting bracket of FIGS. 2-4.

The slide plate 26 may be formed from a single piece of stamped metal. Slide plate 26 includes a laterally-extending base 84 with first and second arms 86, 88 that extend longitudinally rearwardly from opposed lateral end portions 90 and 92 of the base 84. The first and second arms 86 and 88 are configured to be slidable relative to the main plate 24. The first and second arms 86, 88 are dimensioned to engage with the first and second ridges 40, 42 of the main plate 24. More specifically, the first and second arms 86, 88 have a width that generally corresponds with the widths of first and second ridges 40, 42, and a height than enables the arms 86, 88 to slide beneath the first and second bridges 44, 46 and held against the top surfaces of the ridges 40, 42 when the slide plate 26 is mounted to the main plate 24. See FIGS. 3 and 4. Each of the arms 86, 88 also includes one or more counterbored apertures 94, 96, which are configured to receive the screw 68 associated with the plurality of circular detents 66 formed in the ridges 40, 42 of the main plate 24, as described above.

Additionally, the slide plate 26 includes at least one mounting location for the access point. That mounting location could, for example, comprise bore(s) for receiving a fastener such as a screw. In this embodiment, the mounting location is formed by a release button 98 associated with the base 84. The release button 98 includes a tab 100 that facilitates connection of the access point 22 to the mounting bracket 20. More specifically, an upwardly facing opening 102 formed in an end of the access point 22. See FIGS. 8 and 9. The tab 100 snaps into the opening 102 when the access point 22 is pivoted upwardly towards the mounting bracket 20 after being hung on the hooks 48 and 50, which in turn releasably holds the access point 22 in a mounted configuration. In the embodiment shown in FIGS. 1-13, the access point 22 may be further secured to the release button 98 using a screw 104 (FIG. 1) that extends through aligned openings in the main plate 24 and the slide plate 26. When the screw 104 is in place, inadvertent disengagement of the access point 22 from the mounting bracket 20 that may occur when the release button 98 is inadvertently compressed is prevented.

Figure 16:
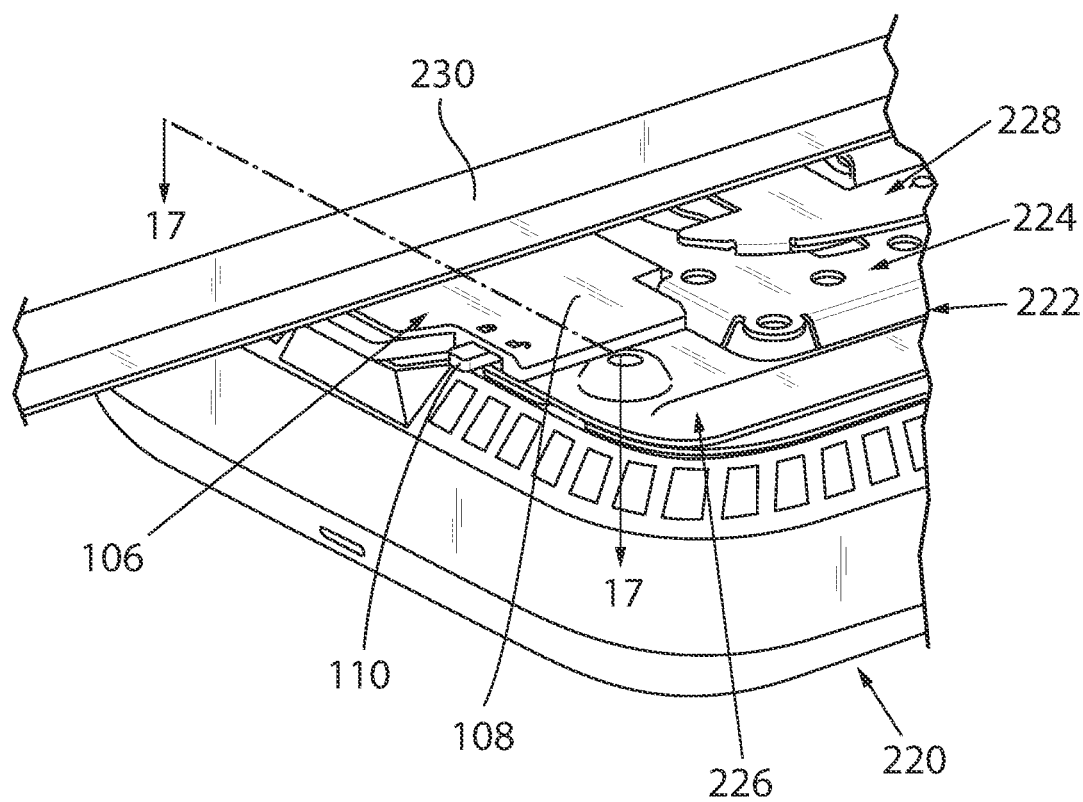
FIG. 16 is a perspective view of the adjustable mounting bracket of FIG. 15 with a locking mechanism.
Figure 17:
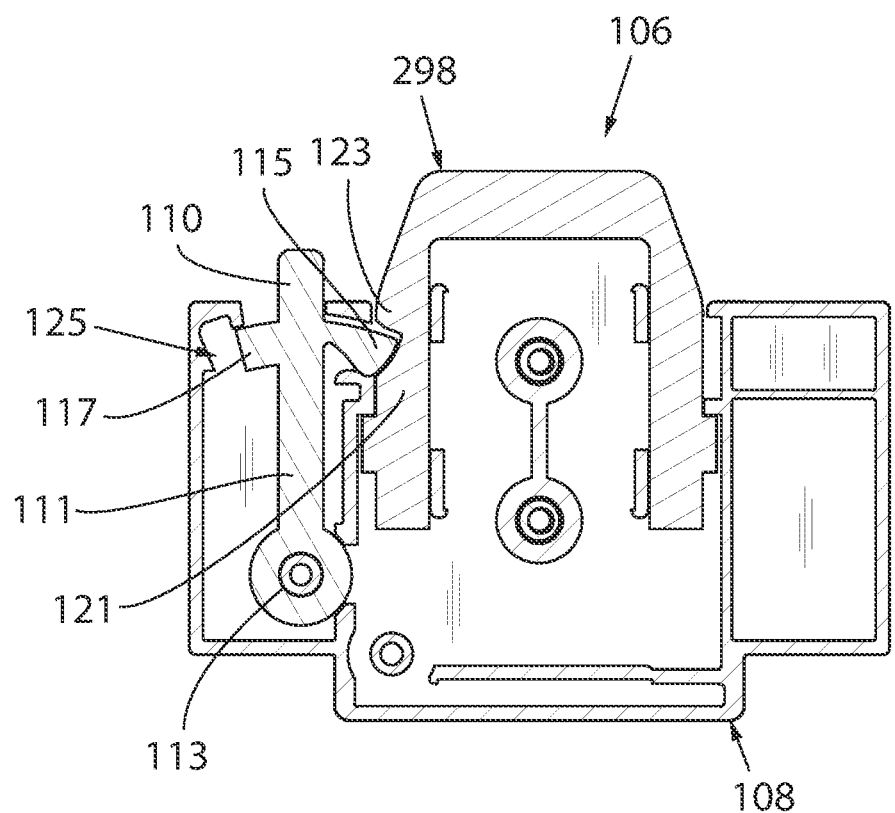
FIG. 17 is a top sectional view of the locking mechanism in a locked position taken about line 17-17 of FIGS. 15 and 16.
Figure 18:
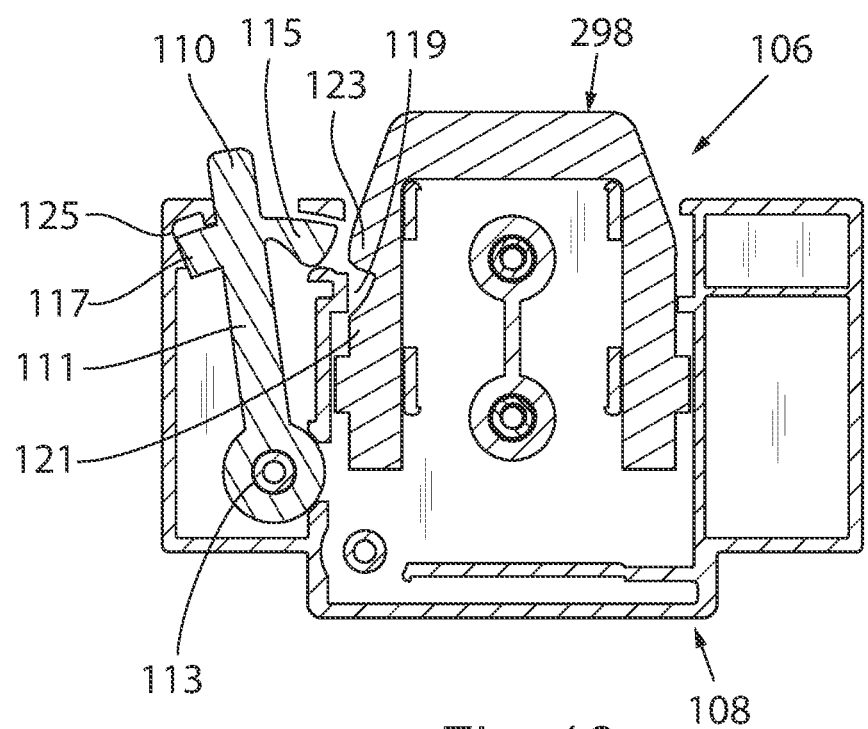
FIG. 18 is a top sectional view of the locking mechanism of FIGS. 15-17 in an unlocked position.

An alternative embodiment of the mounting bracket 220 is shown in FIGS. 15-18, where similar components are designated by the same reference numbers increased by 200. In this embodiment, the access point 222 may be further secured in place at the mounting location using a locking mechanism 106 (FIG. 16). As shown, the locking mechanism 106 includes a housing 108 with a tab 110 extending longitudinally rearwardly therefrom that can be moved between a locked position (FIG. 17) and an unlocked position (FIG. 18). The tab 110 extends from an arm 111 that mounts to the housing 108 about a pivot point 113. Additionally, the arm 111 includes a first finger 115 extending laterally towards the release button 298, as well as a second finger 117 that extends laterally away from the release button 298. Further still, the release button 298 includes a detent/notch 119 formed between a sidewall 121 and a lip 123. As shown in FIGS. 17 and 18, the arm 111 extends substantially longitudinally about the mounting bracket 220 and can be pivoted about the pivot point 113. Thus, in the locked position, the first finger 115 is located within the notch 119, which prevents longitudinal movement of the sidewall 121 that would be caused by downward movement of the release button 298. This results in the locking of the access point 222 to the mounting bracket 220 (FIG. 16), preventing inadvertent disengagement of the access point 222 from the mounting bracket 220 that may occur when the release button 98 is inadvertently compressed. When a user is ready to remove the access point 222, the tab 110 is slide away from the release button 298 to the unlocked position (FIG. 18), in which the second finger 117 abuts a stop 125 adjacent an edge of the housing 108, at which point the first finger 115 is removed from the notch 119. Once the first finger 115 clears the notch 119, the sidewall 121 can move longitudinally about the mounting bracket 220, enabling the release button 298 to be pressed downwardly which results is the disengagement of the access point 222.

In addition to the main plate 24 and the slide plate 26, the mounting bracket 20 may further include a twist clip 28 for facilitating mounting of the mounting bracket 20 to a T-bar 30 of a drop panel 112 of a ceiling. The twist clip 28 also may be formed from a single piece of stamped metal. 112. Referring to FIGS. 2-5, the twist clip 28 is substantially s-shaped with a main body 114 that, in use, lies in a horizontal plane in parallel with the plane of the attachment surface 38 of the main plate 24. The main body 114 of the twist clip 28 has a laterally extending central portion 116, a first leg 118 extending longitudinally forwardly from a first end of the central portion 116, and a second leg 120 extending longitudinally rearwardly from a second end of the central portion 116. The twist clip 28 further includes one or more downwardly-extending tabs that allow the twist clip 28 to engage with the main plate 24. As shown, the twist clip 28 includes a first tab 122 extending downwardly from the rear end of the outer edge of the first leg 118 and a second tab 124 extending downwardly from the front end of the outer edge of the second leg 120e. These tabs 122, 124 are configured to initially be inserted into the larger opening 126 of the arcuate key-shaped openings 70 formed in the attachment plate 38 of main plate 24, after which the entire twist clip 28 can be twisted so that the tabs 122, 124 are located about the narrower end 128 of the arcuate key-shaped openings 70. In this way, the underside of the main plate 24 adjacent to the narrow end 128 of the key-shaped opening 70 rests upon and are supported by the tabs 122, 124 after twisting. Once the twist clip 28 is properly oriented relative to the main plate 24, one or more screws 130 or other fasteners may be driven through openings 131 in the attachment plate 38 of the main plate 24 in order to secure the main plate 24 to the twist clip 28. Circumferential slot openings 131 allow for two different T-Bar widths by orienting the fastening screw at either end point of the circumferential slot. The current designed slot accommodates 9/16" and 15/16" T-Bar widths.

Figure 6:
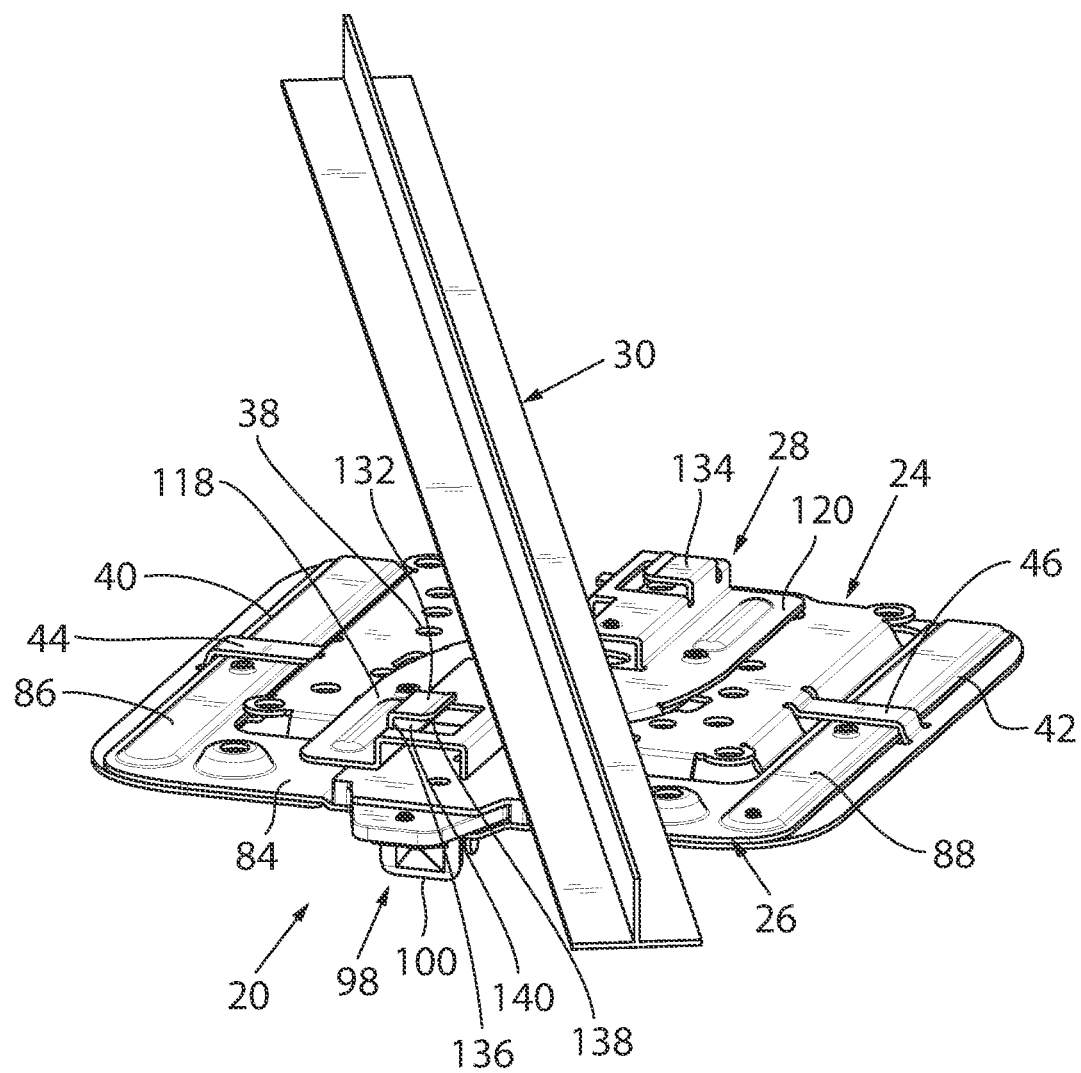
FIG. 6 is a perspective view of the adjustable mounting bracket of FIGS. 2-5 located adjacent a T-bar.
Figure 7:
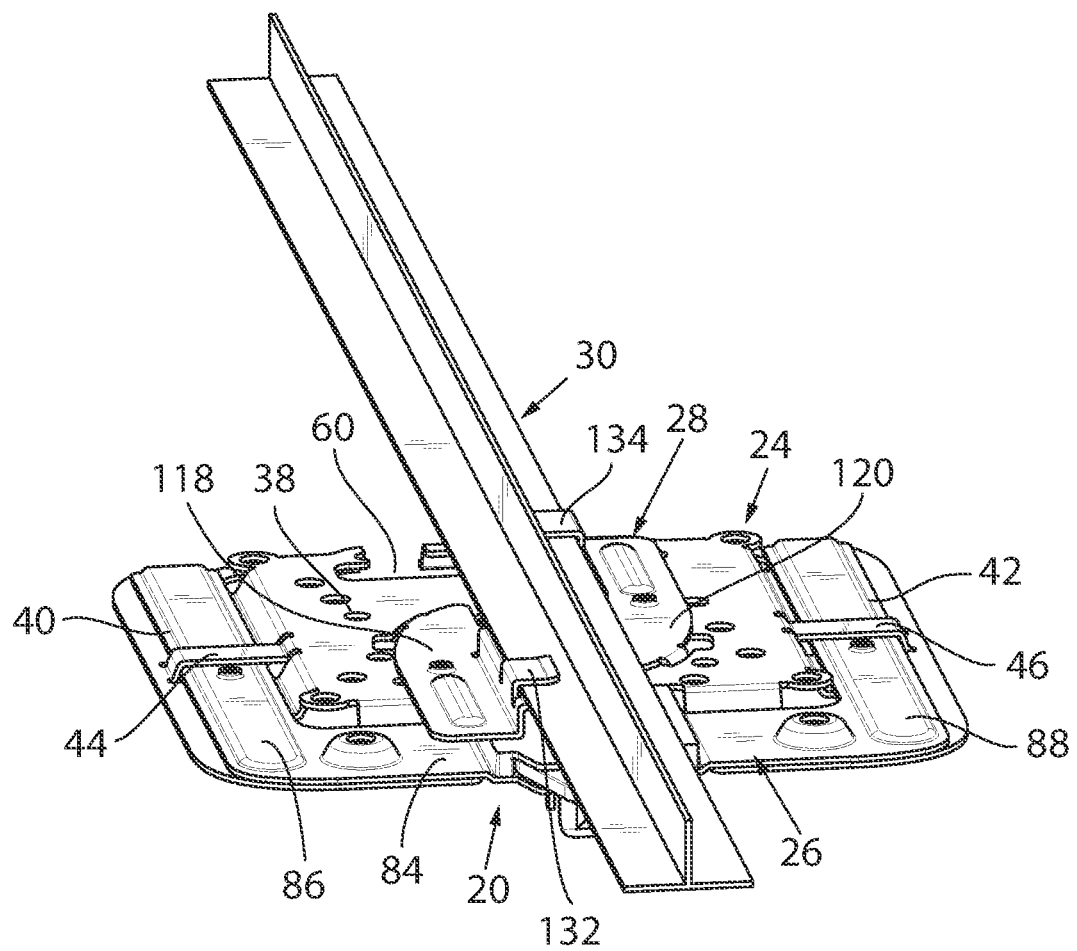
FIG. 7 is a perspective view of the adjustable mounting bracket of FIG. 6 once the bracket is secured to the T-bar.
Figure 22:
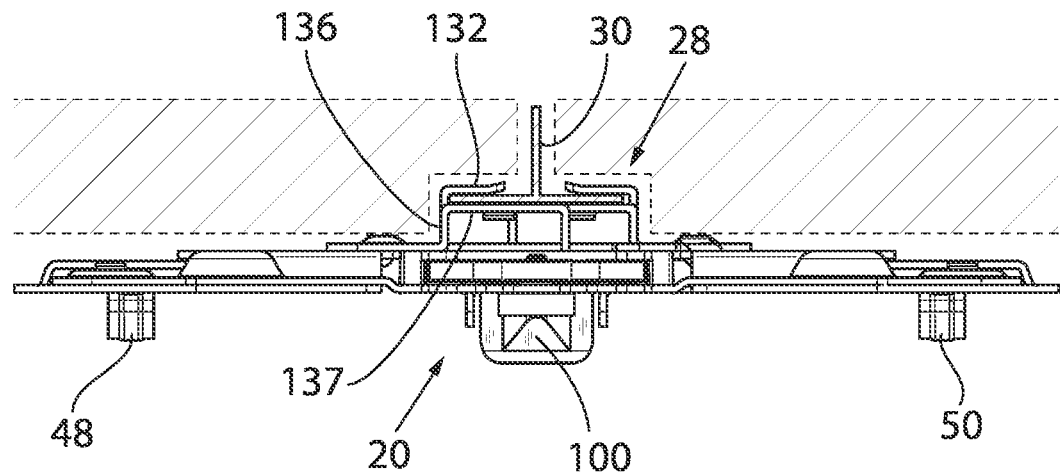
FIG. 22 is an end sectional view of the mounting bracket installed about a T-bar associated with a 6 mm recessed drop ceiling.
Figure 23:
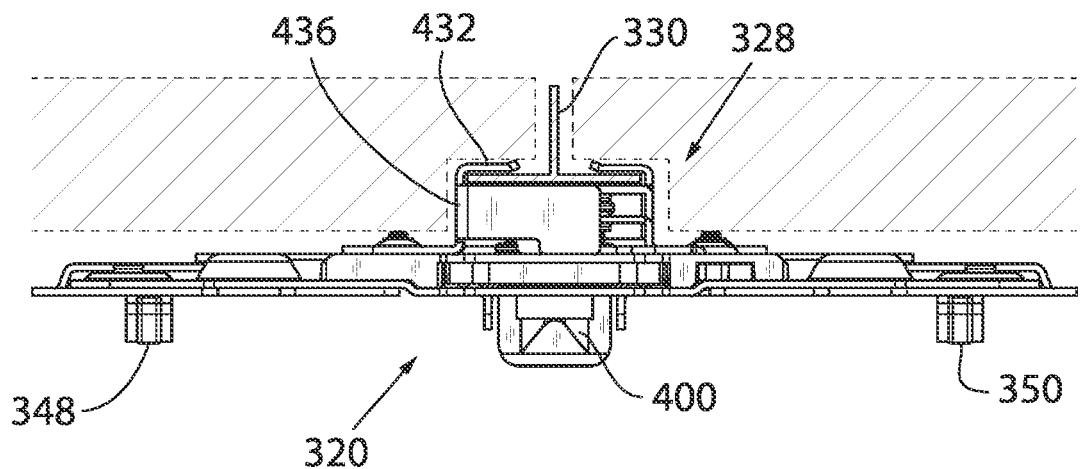
FIG. 23 is an end sectional view of the mounting bracket, installed about a T-bar associated with a 10 mm recessed drop ceiling.

The twist clip 28 includes additional features configured to engage with the T-bar 30 itself to enable the entire mounting bracket 20 to hang from the T-bar 30 as seen in FIGS. 6-7. In the illustrated embodiment, first and second hooks 132, 134 are provided that are vertically offset from the body 114. Only the first hook 132 will be further described, with the second hook 134 having substantially similar components. As shown, the hook 132 has a substantially vertical section 136 extending upwardly from a L-shaped hook plate 137 and a substantially horizontal section 138, with a gap 140 formed between the substantially horizontal section 138 and the L-shaped hook plate 137. The L-shaped hook base 137 and substantially horizontal section 138 are configured to allow sufficient clearance and support for installation relative to the T-bar 30 of a 6 mm recessed drop ceiling. See FIG. 22. Alternatively, the twist clip 328 may not include the L-shaped hook base where the twist clip 328 is mounted to a 10 mm recessed drop ceiling, in which case the substantially horizontal section 438 alone engages with the T-bar 430 as shown in FIG. 23, where similar components are designated by the same reference numbers increased by 300. Of course, other twist clip configurations may be provided having different gap sizes to accommodate different T-bar thicknesses. A gap 140 having a thickness of 6 mm would accommodate a 6 mm thick T-bar, a gap 140 having a thickness of 8 mm would accommodate a 8 mm thick T-bar, etc. These configurations help to ensure that the mounting bracket 20 and access point 22 are mounted flush with the ceiling without displacing the drop panel 112.

In the illustrated embodiment, the substantially horizontal sections 138 of the first and second hooks 132, 134 extend substantially horizontally in opposite directions along the same plane. More specifically, the substantially horizontal section 138 of the first hook 132 extends from the first leg 118 towards the second leg 120, whereas the substantially horizontal portion of the second hook 134 extends from the second leg 120 towards the first leg 118. When installing the twist clip 28 to the T-bar 30, the twist clip 28 is initially located adjacent to the T-bar 30 at an angle such that the hooks 132, 134 are initially spaced from the sides of the T-bar 30. See FIG. 6. Thereafter, the twist clip 28 is twisted so that the substantially horizontal sections 138 of the hooks 132, 134 are located on top of respective sides of the T-bar 30, such that the twist clip 28 securely rests upon the T-bar 30. See FIG. 7. The mounting bracket 20 now is held in place against the T-bar 30 and cannot move without application of an external force rotating the twist clip 28 away from its installed position. At this time, one or more screws or other fasteners may be used to more permanently secure the mounting bracket 20 to the T-bar 30.

As a result of the combination of the main plate 24, the slide plate 26, and the twist clip 28, the mounting bracket 20 can quickly and easily be mounted to the T-bar 30 with minimal tools. In fact, the mounting bracket 20 can be installed to the T-bar 30 in less than 120 seconds, more preferably be installed to the T-bar 30 in less than 90 seconds, and even more preferably be installed to the T-bar 30 in less than 60 seconds.

Figure 13:
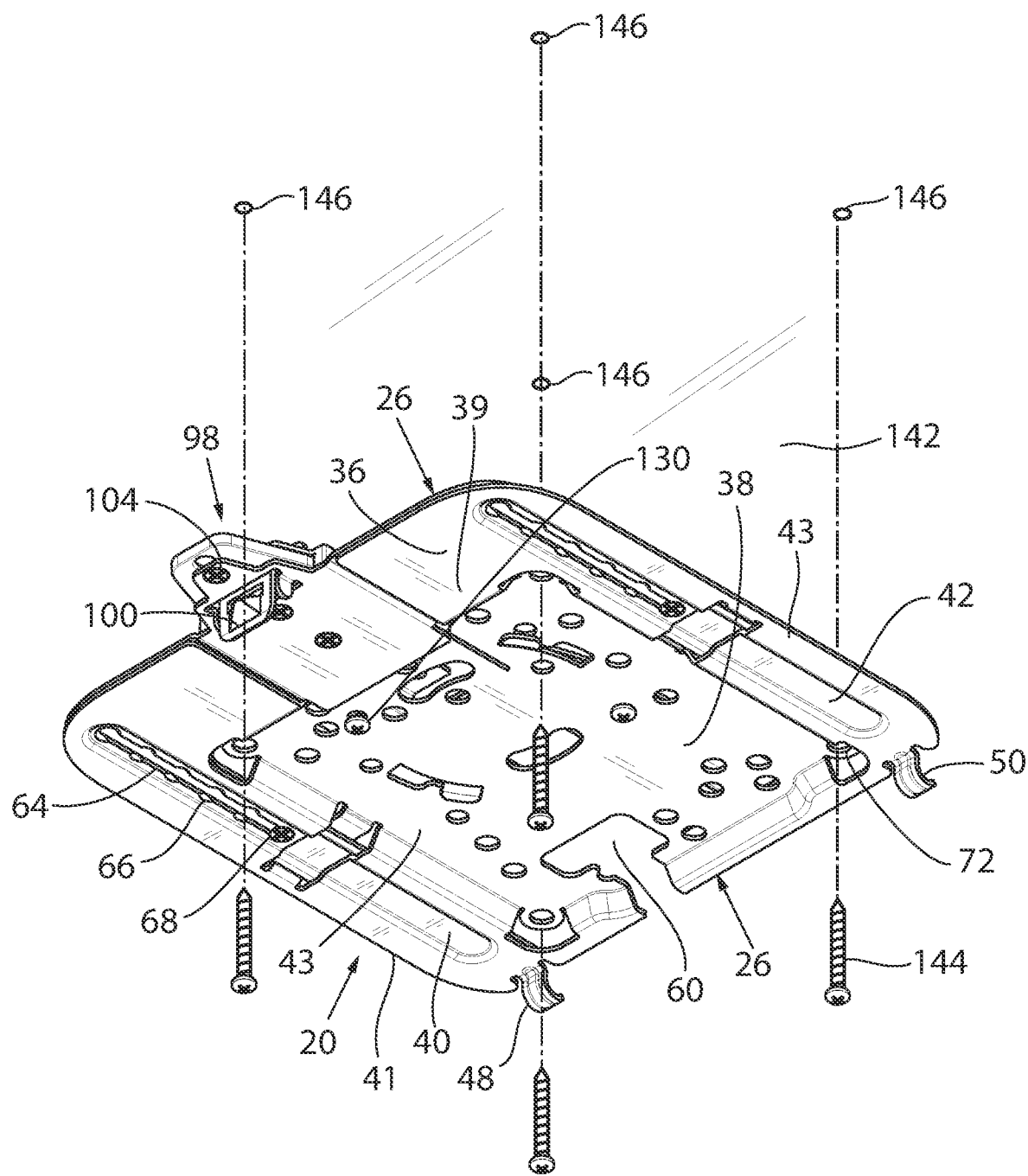
FIG. 13 is a perspective view of the adjustable mounting bracket mounted to a drywall surface.
Figure 19:
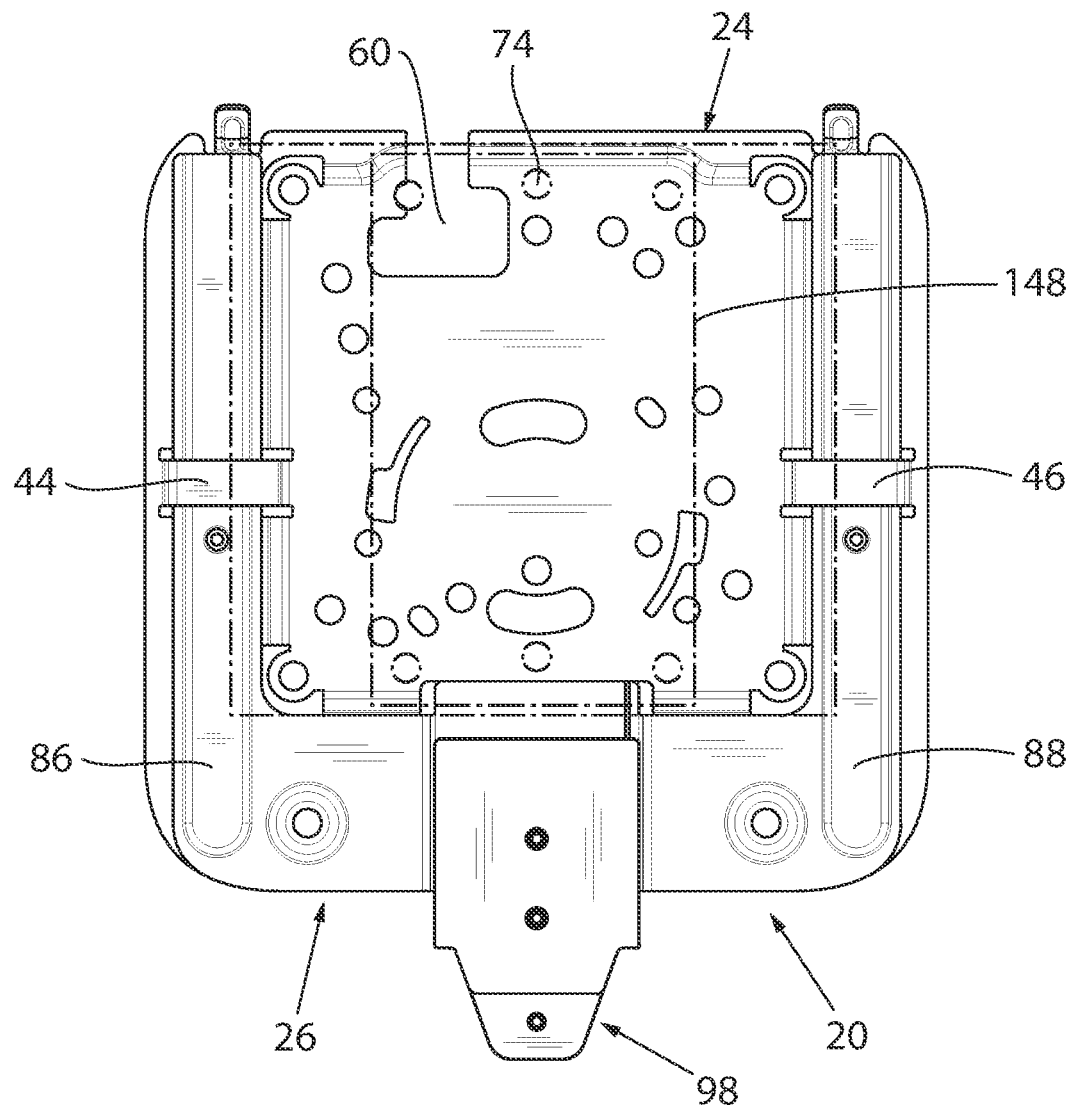
FIG. 19 is a top plan view of the adjustable mounting bracket with a first junction box shown in phantom.
Figure 20:
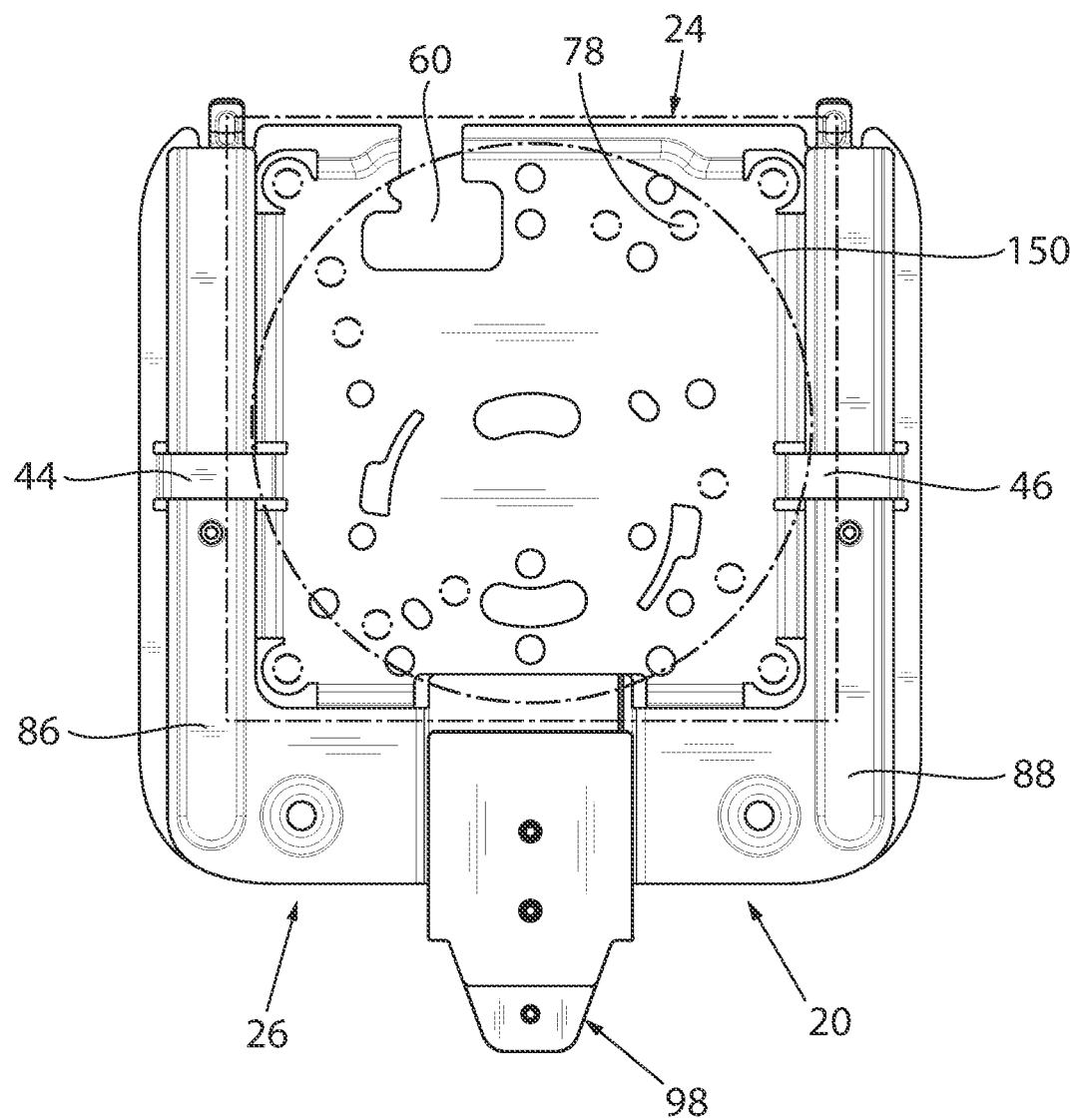
FIG. 20 is a top plan view of the adjustable mounting bracket with a second junction box shown in phantom.
Figure 21:
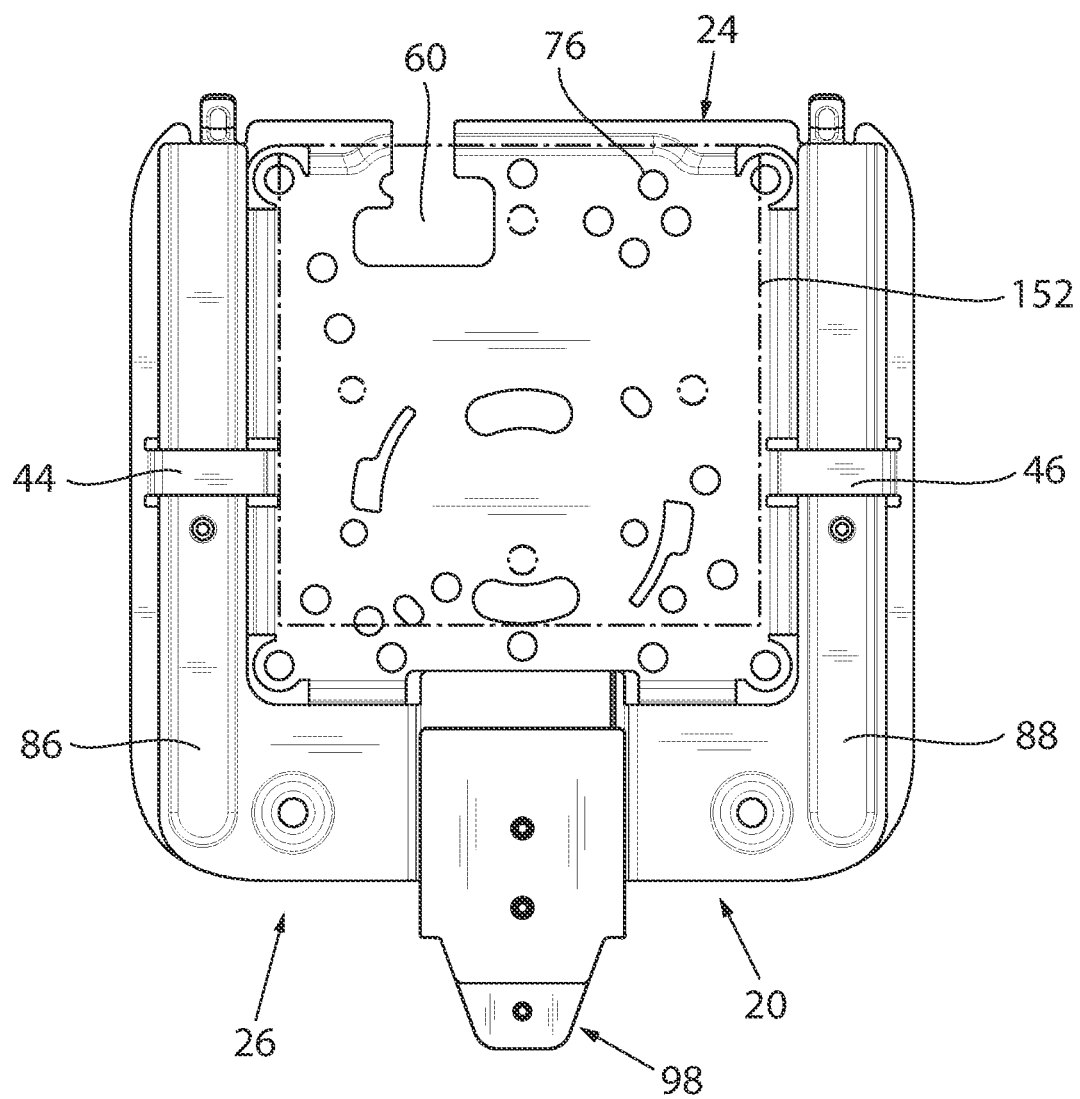
FIG. 21 is a top plan view of the adjustable mounting bracket with a third junction box shown in phantom.

As mentioned above, the mounting bracket 20 can also be used in connection with features other than a T-bar 30, in which case the twist clip 28 is not needed. Rather, the various openings 72, 74, 76, 78, 80, 82 can be used to enable mounting of the mounting bracket 20 to other components. For instance, FIG. 13 shows the mounting bracket 20 being mounted to a drywall ceiling 142, where screws 144 are inserted through the wall openings 72 in the main plate 24 and into anchors 146 contained in the drywall 142. Otherwise, the other openings 74, 76, 78, 80, 82 formed in the main plate 24 are specifically oriented to be compatible with standard junction boxes. FIGS. 19-21 show exemplary junction boxes in phantom with the corresponding openings. More specifically, FIG. 19 shows a single gang junction box 148 secured about the single gang openings 74; FIG. 20 shows a round junction box 150 secured about the round junction openings 78; and FIG. 21 shows a double gang junction box 152 secured about the double gang openings 76.

Regardless of whether the mounting bracket 20 is mounted to a T-bar 30, junction box 148, 150, 152, drywall 142, or any other portion of a building, once installation is completed, the mounting bracket 20 can be repeatedly adjusted to accommodate different access points 22 without the need to uninstall the mounting bracket 20 from the building. More specifically, when a new access point 22 or other compatible electronic device is needed, a user can determine whether the new electronic device is of a different size than the old electronic device. If so, the screws 68 contained within the openings 66 of the slots 64 can be loosened, after which the slide plate 26 can be slid relative to the main plate 24 so that the mounting bracket 20 is configured to accommodate a larger or smaller electronic device 22. The mounting bracket 20 is configured accommodate any size of electronic device 22, including for instance, a device 22 having dimensions of 157 mm×157 mm, 172 mm×172 mm, 182 mm×182 mm, 192 mm×192 mm, 202 mm×202 mm, or 212 mm×212 mm.

Figure 11:
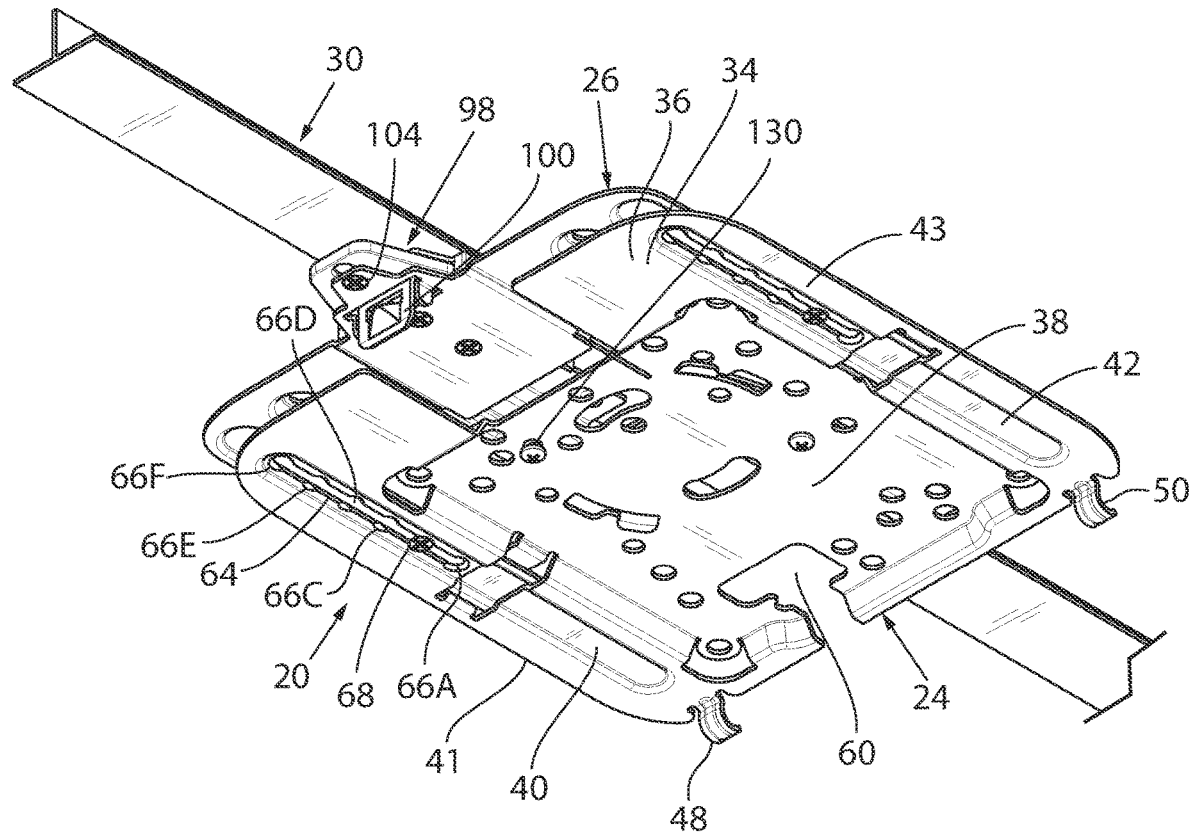
FIG. 11 is a perspective view of the adjustable mounting bracket in a second configuration.
Figure 12:
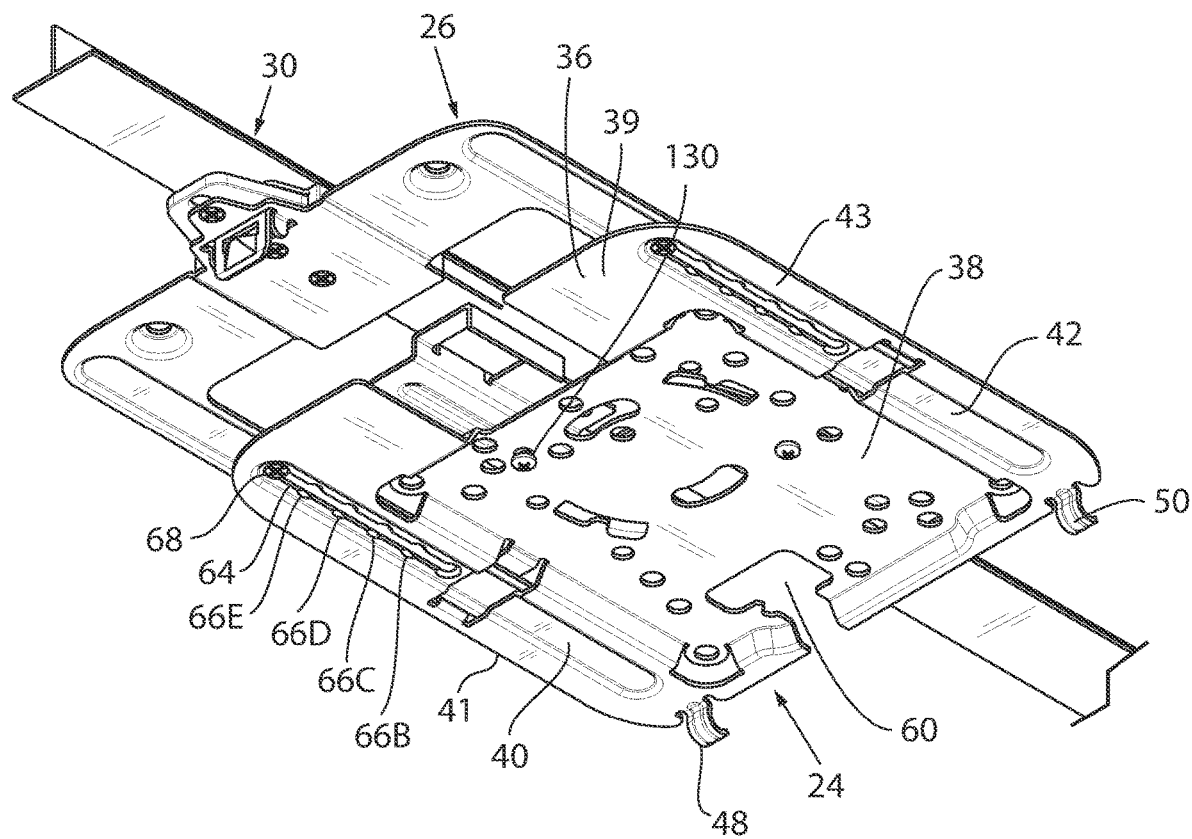
FIG. 12 is a perspective view of the adjustable mounting bracket in a third configuration.

Turning specifically to the figures, FIG. 10 shows the mounting bracket 20 in an initial position, in which the mounting bracket 20 is configured to receive the smallest electronic device configuration. A larger electronic device can be mounted on the mounting bracket 20 simply by removing the smaller electronic device by first either removing the screw 104 or sliding the tab 110 to disengage the locking mechanism 106, after which the tab 100 can be disengaged to release the electronic device. Thereafter, the electronic device is pivoted downwardly about the hooks 48, 50 and released, at which point it can be completely disengaged from the mounting bracket 20. Next, the screws 68 holding the slide plate 26 in place relative to the main plate 24 can be loosened. Thereafter, the slide plate 26 can be slid, for instance to a setting that is 10 millimeters longer as shown in FIG. 11, or a setting that is 50 millimeters longer as shown in FIG. 12, or any intermediary setting. Once a desired setting is found, the screws 68 are tightened. A new electronics device now can be mounted on the bracket 20 as described above. This process can be done as many times as desired when a new access point 22 is needed.

Although the best mode contemplated by the inventors of carrying out the present invention is disclosed above, practice of the above invention is not limited thereto. It will be manifest that various additions, modifications and rearrangements of the features of the present invention may be made without deviating from the spirit and the scope of the underlying inventive concept.

It should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

What is claimed is:

1. An adjustable mounting bracket for holding an electronic device comprising:
   a main plate configured to be mounted on a support; and
   a slide plate configured to slide relative to the main plate;
   wherein each of the slide plate and the main plate has at least one mounting point configured for attachment to an electronic device, thereby permitting electronic devices of different lengths to be mounted on the mounting bracket depending on the position of the slide plate relative to the main plate, wherein the main plate includes
      a base plate,
      an attachment plate that is spaced vertically above the base plate,
      at least one ridge located adjacent the attachment plate and extending longitudinally of the base plate,
      a slot extending through the at least one ridge,
      at least two detents formed in the slot; and wherein the slide plate is configured to be movable between:
         a first position in which the slide plate is secured to the main plate about a first detent formed in the slot, and
         a second position in which the slide plate is secured to the main plate about a second detent formed in the slot;
      wherein the first position accommodates an electronic device having a first length; and
      wherein the second position accommodates an electronic device having a second length.

2. The adjustable mounting bracket of claim 1, wherein the ridge comprises a first ridge located adjacent a first side of the attachment plate, and further comprising a second ridge located adjacent a second side of the attachment plate, wherein a first slot is formed in the first ridge and a second slot is formed in the second ridge.

3. The adjustable mounting bracket of claim 2, wherein the slide plate further comprises:
   a base having first and second laterally spaced end portions;
   a first arm extending longitudinally rearwardly from the first end portion of the base; and
   a second arm extending longitudinally rearwardly from the second end portion of the base;
   wherein the first arm is configured to be slidable upon the first ridge; and
   wherein the second arm is configured to be slidable upon the second ridge.

4. An adjustable mounting bracket for holding an electronic device comprising:
   a main plate configured to be mounted on a support; and
   a slide plate configured to slide relative to the main plate:
   wherein each of the slide plate and the main plate has at least one mounting point configured for attachment to an electronic device, thereby permitting electronic devices of different lengths to be mounted on the mounting bracket depending on the position of the slide plate relative to the main plate, further comprising:
      a twist clip comprising:
         a body; and
         at least two hooks that extend from the body and that are configured to hang from a section of a building.

5. The adjustable mounting bracket of claim 4, wherein the twist clip further comprises at least two tabs extending from the body; and
   wherein the main plate further comprises a plurality of openings formed therein;
   wherein the twist clip is movable between:
      a first position where the at least two tabs are inserted through the plurality of openings; and
      a second position where the twist clip is twisted so the at least two tabs engage with the main plate.

6. An adjustable mounting bracket for holding an electronic device comprising:
   a main plate configured to be mounted on a support; and
   a slide plate configured to slide relative to the main plate:
   wherein each of the slide plate and the main plate has at least one mounting point configured for attachment to an electronic device, thereby permitting electronic devices of different lengths to be mounted on the mounting bracket depending on the position of the slide plate relative to the main plate, further comprising a release button associated with one or both of the main plate and the slide plate configured to releasably hold the electronic device relative to the main plate and slide plate.

7. The adjustable mounting bracket of claim 6, further comprising a locking mechanism having a tab that is movable between:
- a locked position in which movement of the release button is prevented; and
- an unlocked position in which movement of the release button is enabled.

8. An adjustable mounting bracket for holding an electronic device comprising:
- a main plate configured to be mounted on a support; and
- a slide plate configured to slide relative to the main plate;
wherein each of the slide plate and the main plate has at least one mounting point configured for attachment to an electronic device, thereby permitting electronic devices of different lengths to be mounted on the mounting bracket depending on the position of the slide plate relative to the main plate, wherein the mounting point on the main frame comprises a hook about which the electronic device can pivot about a horizontal pivot axis.

9. A method of installing an adjustable mounting bracket configured to hold an electronic device at first and second longitudinally spaced mounting points located on a main plate of the mounting bracket and a slide plate of the mounting bracket, respectively, the method comprising the steps of:
- sliding a slide plate relative to a main plate;
- securing the slide plate relative to the main plate at a first configuration having a first length;
- releasably attaching a first end of the electronic device to the first mounting point on the main plate; and
- releasably attaching a second end of the electronic device to the second mounting point on the slide plate.

10. The method of claim 9, further comprising the step of releasably attaching the first end of the electronic device to at least one hook extending from the first mounting point on the main plate.

11. The method of claim 9, further comprising the step of releasably attaching the second end of the electronic device to a tab extending from the second mounting point on the slide plate.

12. The method of claim 11, further comprising the steps of:
- temporarily locking a release button associated with the tab in place to prevent disengagement of electronic device from the slide plate;
- unlocking the release button;
- disengaging the tab from the second end of the electronic device; and
- removing the electronic device.

13. The method of claim 12, wherein the temporarily locking step comprises sliding a tab associated with a locking mechanism to a locked position in which movement of the release button is prevented; and
- wherein the unlocking step comprises sliding the tab associated with the locking mechanism to an unlocked position.

14. The method of claim 9, further comprising the steps of:
- releasing the slide plate from the main plate;
- sliding the slide plate longitudinally relative to a main plate to vary a spacing between the first and second mounting points; and
- securing the slide plate relative to the main plate at a second configuration having a second length.

15. The method of claim 9, further comprising the steps of:
- inserting a plurality of tabs extending from a twist clip into a plurality of arcuate slots formed in the main plate; and
- twisting the twist clip to engage the plurality of tabs with the main plate.

16. An adjustable mounting bracket for holding an electronic device relative to a building comprising:
- a main plate comprising:
  - a base having a first electronic device mounting point located thereon;
  - an attachment plate located vertically above the base;
  - first and second ridges that extend longitudinally of the main plate, that are located vertically above the base and vertically beneath the attachment plate, and that are located adjacent opposite sides of the attachment plate, and that have a plurality of longitudinally spaced discrete mounting locations formed therein;
- a slide plate that is configured to slide relative to the main plate, the slide plate including:
  - a base having first and second laterally spaced end portions and having a second electronic device mounting point located thereon;
  - a first arm extending longitudinally rearwardly from the first end of the base; and
  - a second arm extending longitudinally rearwardly from the second end of the base;
  - wherein the first arm is configured to be slidable upon the first ridge; and
  - wherein the second arm is configured to be slidable upon the second ridge; and
- fasteners configured to releasably secure the first and second arms to the first and second ridges so as to permit slide plate movement between first and second longitudinally spaced positions, thereby varying a spacing between the first and second mounting points.

17. The adjustable mounting bracket of claim 16, wherein each of the ridges has a slot formed therethrough, and wherein a plurality of longitudinally-spaced detents are formed in each slot so as to form discrete attachment points for securing the slide plate to the main plate.

18. The adjustable mounting bracket of claim 16, further comprising a twist clip comprising:
- a body;
- at least two hooks configured to hang from a support; and
- at least two tabs extending from the body;
wherein the attachment plate further comprises a plurality of openings formed therein;
wherein the twist clip is movable between:
- a first position where the at least two tabs are inserted through two of the plurality of openings; and
- a second position where the twist clip is twisted so the at least two tabs engage with the main plate.

19. The adjustable mounting bracket of claim 16, further comprising:
- a release button associated with one or both of the main plate and the slide plate configured to releasably hold the electronic device relative to the main plate and slide plate; and
- a locking mechanism comprising:
  - a tab that is movable between a locked position and an unlocked position;

a finger associated with the tab and configured to:
   prevent movement of the release button in the locked position; and
   enable movement of the release button in the unlocked position.

\* \* \* \* \*